(12) United States Patent
Sills et al.

(10) Patent No.: US 8,536,561 B2
(45) Date of Patent: Sep. 17, 2013

(54) MEMORY CELLS AND MEMORY CELL ARRAYS

(75) Inventors: Scott E. Sills, Boise, ID (US); Gurtej S. Sandhu, Boise, ID (US); Sanh D. Tang, Boise, ID (US); John Smythe, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 43 days.

(21) Appl. No.: 13/275,168

(22) Filed: Oct. 17, 2011

(65) Prior Publication Data

US 2013/0092894 A1 Apr. 18, 2013

(51) Int. Cl.
H01L 47/00 (2006.01)

(52) U.S. Cl.
USPC ............................. 257/5; 257/E45.001

(58) Field of Classification Search
USPC ............. 257/4, 5, E45.001, 2, 49, 52, 66
See application file for complete search history.

(56) References Cited

U.S. PATENT DOCUMENTS

| | | | |
|---|---|---|---|
| 5,793,112 A | 8/1998 | Hasegawa et al. | |
| 6,673,693 B2 * | 1/2004 | Kirchhoff | 438/409 |
| 6,709,874 B2 | 3/2004 | Ning | |
| 6,887,792 B2 | 5/2005 | Perlov et al. | |
| 7,361,586 B2 | 4/2008 | Adem et al. | |
| 7,365,382 B2 | 4/2008 | Willer et al. | |
| 7,435,648 B2 | 10/2008 | Hsu et al. | |
| 7,449,354 B2 | 11/2008 | Merchant et al. | |
| 7,888,711 B2 | 2/2011 | Cheung et al. | |
| 2008/0247214 A1 * | 10/2008 | Ufert | 365/148 |
| 2009/0250681 A1 * | 10/2009 | Smythe et al. | 257/4 |
| 2009/0272960 A1 | 11/2009 | Srinivasan et al. | |
| 2009/0317540 A1 | 12/2009 | Sandhu et al. | |
| 2010/0301330 A1 | 12/2010 | Ho et al. | |
| 2011/0199812 A1 | 8/2011 | Kitagawa et al. | |

OTHER PUBLICATIONS

Kau et al., "A stackable cross point phase change memory", IEEE Xplore, 2009, pp. 27.1.1-27.1.4.
Meyer et al., "Oxide Dual-Layer Memory Element for Scalable Non-Volatile Cross-Point Memory Technology", IEEE Xplore, 2008, pp. 1-5.
U.S. Appl. No. 12/705,918, filed Feb. 15, 2010. Applicant: Meade.
U.S. Appl. No. 12/705,928, filed Feb. 15, 2010. Applicant: Meade et al.
U.S. Appl. No. 12/886,283, filed Sep. 20, 2010. Applicant: Smythe et al.

* cited by examiner

*Primary Examiner* — Nikolay Yushin
(74) *Attorney, Agent, or Firm* — Wells St. John P.S.

(57) ABSTRACT

Some embodiments include memory cells. The memory cells may have a first electrode, and a trench-shaped programmable material structure over the first electrode. The trench-shape defines an opening. The programmable material may be configured to reversibly retain a conductive bridge. The memory cell may have an ion source material directly against the programmable material, and may have a second electrode within the opening defined by the trench-shaped programmable material. Some embodiments include arrays of memory cells. The arrays may have first electrically conductive lines, and trench-shaped programmable material structures over the first lines. The trench-shaped structures may define openings within them. Ion source material may be directly against the programmable material, and second electrically conductive lines may be over the ion source material and within the openings defined by the trench-shaped structures.

13 Claims, 7 Drawing Sheets

MEMORY CELLS AND MEMORY CELL ARRAYS

TECHNICAL FIELD

Memory cells and memory cell arrays.

BACKGROUND

Memory is one type of integrated circuitry, and is used in computer systems for storing data. Integrated memory is usually fabricated in one or more arrays of individual memory cells. The memory cells are configured to retain or store memory in at least two different selectable states. In a binary system, the states are considered as either a "0" or a "1". In other systems, at least some individual memory cells may be configured to store more than two levels or states of information.

An example memory device is a programmable metallization cell (PMC). Such may be alternatively referred to as a conductive bridging RAM (CBRAM), nanobridge memory, or electrolyte memory. A PMC may use ion conductive material (for instance, a suitable chalcogenide or any of various suitable oxides) sandwiched between a pair of current conductive electrodes, and such material may be referred to as "switching" material or as a "programmable" material. A suitable voltage applied across the electrodes can generate current-conductive super-ionic clusters or conducting filaments. Such may result from ion transport through the ion conductive material which grows the clusters/filaments from one of the electrodes (the cathode) and through the ion conductive material. The clusters or filaments create current-conductive paths between the electrodes. An opposite voltage applied across the electrodes essentially reverses the process and thus removes the conductive paths. A PMC thus comprises a high resistance state (corresponding to the state lacking a conductive bridge extending through the switching material) and a low resistance state (corresponding to the state having the conductive bridge extending through the switching material), with such states being reversibly interchangeable with one another.

Although there has been some effort toward development of PMC devices, there remains a need for improved memory cells, and improved memory cell arrays. Accordingly, it would be desirable to develop new memory cells and memory cell arrays.

DETAILED DESCRIPTION OF THE ILLUSTRATED EMBODIMENTS

Some embodiments include new memory cell architectures. The memory cells may be PMC devices in which programmable material is formed in upwardly-opening trench shapes. Additional structures of the PMC devices (for instance, an electrode and/or an ion source material) may be formed to extend within the openings in the trench shapes. Such may enable PMC devices to be formed with fewer masking steps than are utilized in conventional processing. Further, the PMC devices may be relatively compact compared to conventional memory cells in that some components of the devices are nested within the trench-shaped programmable material. This may enable the PMC devices described herein to be utilized in highly integrated circuitry such as, for example, memory arrays.

Example embodiments are described with reference to FIGS. 1-10.

Figure 1:
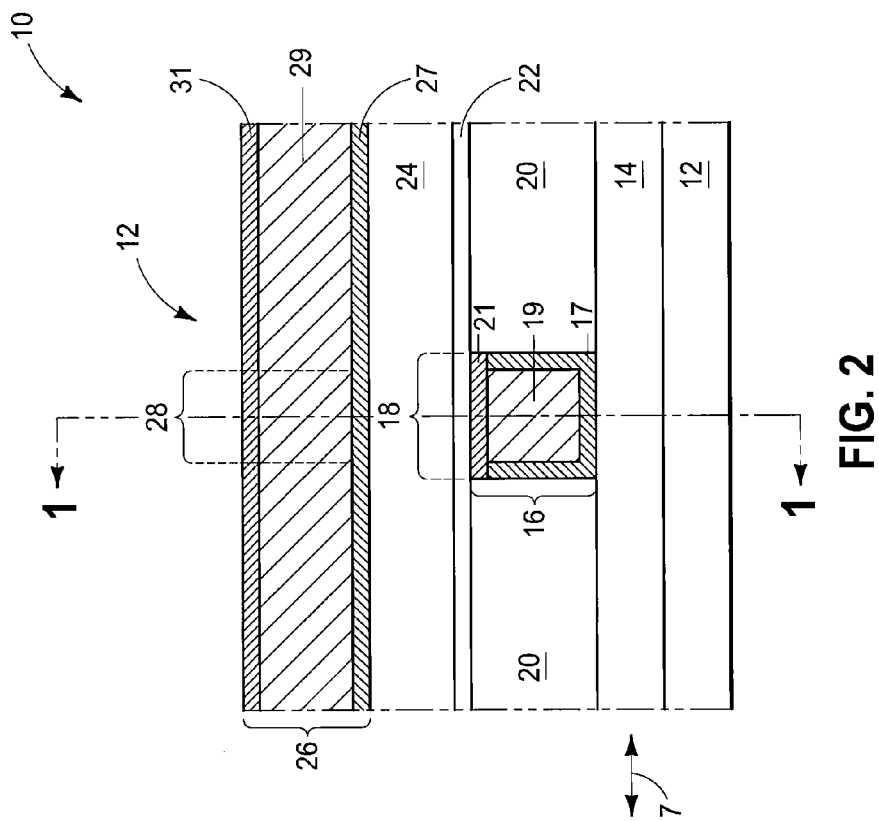
FIGS. 1 and 2 are diagrammatic cross-sectional views of an example embodiment memory cell. The view of FIG. 1 is along the line 1-1 of FIG. 2, and the view of FIG. 2 is along the line 2-2 of FIG. 1.
Figure 2:
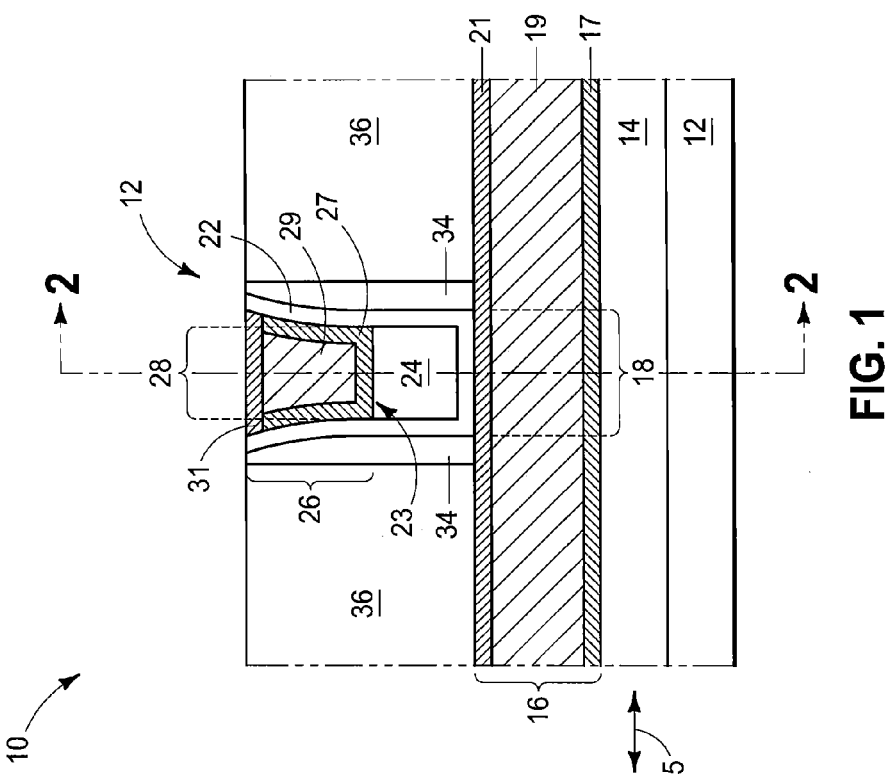

Referring to FIGS. 1 and 2, an example memory cell 12 is shown as part of a semiconductor construction 10. The semiconductor construction includes a semiconductor base 12 having a dielectric material 14 thereover, and having an electrically conductive line 16 over the dielectric material 14.

In some embodiments, base 12 may comprise semiconductor material. For instance, base 12 may comprise, consist essentially of, or consist of monocrystalline silicon. In such embodiments, the base may be referred to as a semiconductor substrate, or as a portion of a semiconductor substrate. The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductive substrates described above. Although base 12 is shown to be homogenous, the base may comprise numerous materials in some embodiments. For instance, base 12 may correspond to a semiconductor substrate containing one or more materials associated with integrated circuit fabrication. In such embodiments, such materials may correspond to one or more of refractory metal materials, barrier materials, diffusion materials, insulator materials, etc; and/or may include additional integrated circuitry, such as, for example, transistor access devices.

The dielectric material 14 may comprise any suitable composition or combination of compositions; and in some embodiments may comprise, consist essentially of, or consist of silicon oxide.

The electrically conductive line 16 extends along an axis 5 parallel to the cross-section of FIG. 1, and orthogonal to the cross-section of FIG. 2. In the shown embodiment, the conductive line 16 comprises a barrier 17 that extends along the sidewalls and bottom of the line, a core 19 over the barrier 17, and another barrier 21 over the core 19. The core 19 may comprise any suitable material, and in some embodiments may comprise, consist essentially of, or consist of copper. The barrier layers 17 and 21 may be barriers to copper migration, and may comprise any suitable materials. For instance, the barrier layers 17 and 21 may comprise one or more of cobalt, tantalum and ruthenium. In some embodiments, one or both of the barrier layers may comprise a mixture of cobalt, tungsten and phosphorus. In some embodiments, the core 19 may comprise an electrically conductive material which does not have migratory constituents (for instance, the core may consist of metal other than copper; such as, for example, tungsten, titanium, platinum, etc.), and in such embodiments the barrier layers 17 and 21 may be omitted.

The electrically conductive line 16 comprises a region 18 which corresponds to an electrode of the memory cell 12. The conductive line is an example of a wiring component which may be electrically coupled with the electrode of the memory cell. In other embodiments, other wiring components may be utilized alternatively, or in addition to, the conductive line. Further, although the conductive line is shown encompassing the electrode 18, in other embodiments the electrode may be spaced from the line by another electrical component; such as, for example, a select device (for instance, a diode or an ovonic threshold switch).

A dielectric material 20 is along sidewalls of the conductive line 16, as shown in FIG. 2. The dielectric material 20 may comprise any suitable composition, and in some embodiments may comprise silicon dioxide. The dielectric material 20 may be the same composition as the dielectric material 14 in some embodiments, and may be a different composition from dielectric material 14 in other embodiments. The conductive line 16 may be formed to extend within dielectric material 20 by, for example, conventional damascene processing or other known methods.

A programmable material 22 is over the electrode 18. The programmable material is trench-shaped (as shown in FIG. 1), and has an opening 23 defined therein. In the embodiment of FIGS. 1 and 2, the trench-shaped programmable material 22 forms a trough that extends along a direction of an axis 7 shown in FIG. 2. Such trough extends orthogonally to the direction of axis 5 (FIG. 1); or in other words orthogonally to the line 16.

An ion source material 24 is within the opening 23 defined by the trench-shaped material 22. The ion source material is directly against the programmable material 22. In the shown embodiment, the ion source material only partially fills opening 23 to leave a remaining portion of the opening over the ion source material.

An electrically conductive line 26 is over the ion source material and within the opening 23.

In the shown embodiment, the electrically conductive line 26 comprises an electrically conductive barrier 27 that extends along the sidewalls and bottom of the line, a core 29 over the barrier 27, and another barrier 31 over the core 29. The core 29 may comprise any suitable material, and in some embodiments may comprise, consist essentially of, or consist of copper. The barrier layers 27 and 31 may be barriers to copper migration and/or barriers to the ion source material, and may comprise any suitable materials. For instance, the barrier layers 27 and 31 may comprise one or more of cobalt, tantalum and ruthenium. In some embodiments, one or both of the barrier layers may comprise a mixture of cobalt, tungsten and phosphorus. In some embodiments, the core 29 may comprise an electrically conductive material which does not have migratory constituents (for instance, the core may consist of material other than copper), and in such embodiments the barrier layers 27 and 31 may be omitted.

The electrically conductive line 26 comprises a region 28 which corresponds to an electrode of the memory cell 12. The electrodes 18 and 28 may be referred to as first and second electrodes, respectively, in some embodiments. Although the electrode 28 is shown being encompassed by the line 26, in other embodiments the electrode may be spaced from the line 26 by another electrical component; such as, for example, a select device (for instance, a diode or an ovonic threshold switch).

Electrode 18 may comprise an electrochemically active surface against the adjacent programmable material 22. Any suitable electrochemically active materials may be utilized along said surface, such as, for example, copper, silver, alloys including at least one of copper and silver, etc. In contrast, the electrode 28 may comprise an electrochemically inactive surface against the ion source material 24. The electrochemically inactive surface may comprise any suitable electrically conductive compositions or combinations of compositions, and may, for example, comprise, consist essentially of, or consist of one or more of various metals (for instance, titanium, tantalum, ruthenium, tungsten, platinum, mixed metal alloys, etc.) and metal-containing compounds (for instance, metal nitride, metal carbide, metal silicide, etc.).

The programmable material 22 may be a solid, gel, or any other suitable phase, and may comprise chalcogenide-type materials (for instance, materials comprising germanium in combination with one or more of antimony, tellurium, sulfur and selenium), oxides (for instance, zirconium oxide, titanium oxide, hafnium oxide, aluminum oxide, tungsten oxide, silicon oxide, etc.) and/or any other suitable materials. The programmable material reversibly retains at least one conductive bridge between electrode 18 and ion source material 24 during operation of the memory cell. Specifically, the programmable material may be reversibly switched between a high resistance state and a low resistance state to program the memory cell. The programmable material is in the low resistance state when the conductive bridge is retained within the programmable material, and is in the high resistance state when the conductive bridge is not continuous across the programmable material. The conductive bridge may be formed by providing a suitable electric field of a first polarity between the electrodes 18 and 28 to cause ion migration from ion source material 24 into the programmable material 22 to thereby create one or more filaments corresponding to such conductive bridge. The conductive bridge may be removed by providing an electric field of a second polarity, opposite to the first polarity, between the electrodes 18 and 28 such that material of the conductive bridge is dispersed to effectively dissolve such conductive bridge.

The ion source material 24 contributes the ions which ultimately form the conductive bridge across the programmable material 22. The ion source material may comprise any suitable composition or combination of compositions; and in some embodiments will comprise one or both of copper and silver, and thus may be configured for contributing copper cations and/or silver cations for formation of the conductive bridge. For instance, the ion source material may comprise a combination of copper and tellurium. The ion source material is electrically conductive, but is not shown with cross-hatching in FIGS. 1 and 2 in order to simplify the drawings.

Figure 3:
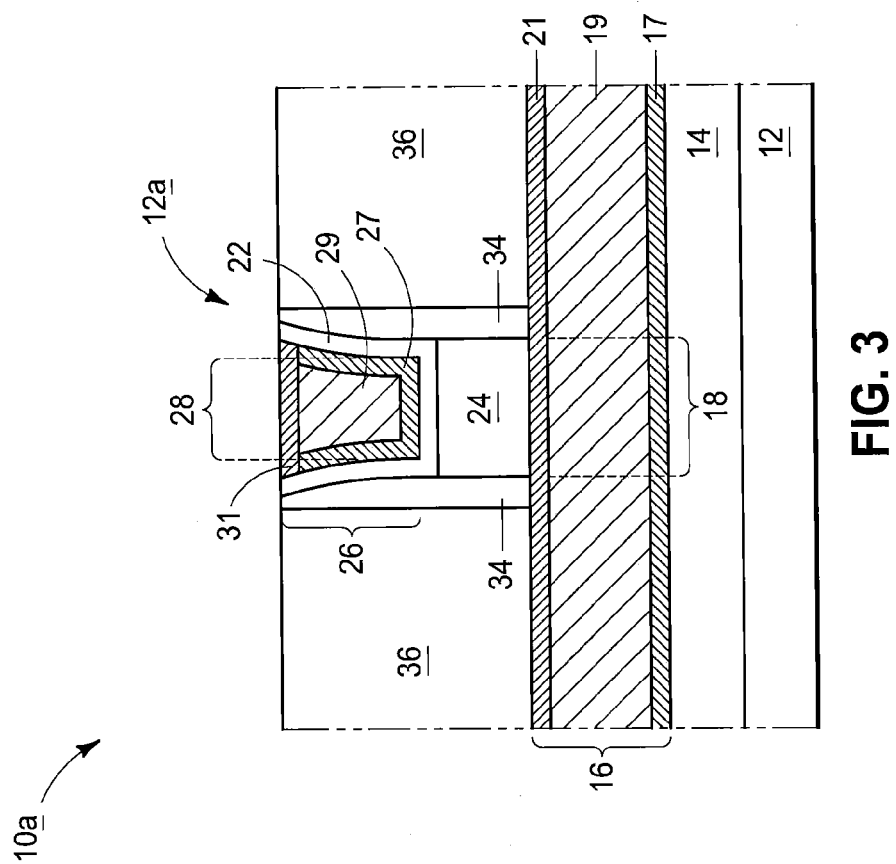
FIG. 3 is a diagrammatic cross-sectional view of another example embodiment memory cell. The view of FIG. 3 is along a similar cross-section as the view of FIG. 1.

In the embodiment of FIGS. 1 and 2, both the ion source material 24 and the second electrode 28 are entirely contained within the opening in the trench-shaped structure of programmable material 22. In other embodiments, the ion source material may not be within such opening (for example, FIG. 3 shows an embodiment in which the ion source material is not within the opening in the trench-shaped structure of the programmable material), or the top electrode may not be within such opening (for instance, in some embodiments the ion source material may entirely fill the opening within the trench-shaped structure of the programmable material).

The construction 10 comprises a dielectric material 34 along the outer sidewalls of the trench-shape of the programmable material 22. The dielectric material 34 is configured as liners along such sidewalls. In some embodiments, the dielectric material may comprise high k material; and may, for example, comprise, consist essentially of, or consist of silicon nitride. A "high k" dielectric material is any dielectric material having a dielectric constant greater than 3.9, or in other words, having a dielectric constant greater than that of silicon dioxide.

The dielectric material 34 may form a lateral barrier along the memory cell, and may be a barrier to preclude migration of components of the memory cell laterally outward of the memory cell. For instance, the dielectric material 34 may be a barrier relative to migration of tellurium and/or copper in embodiments in which the ion source material 24 comprises the combination of copper and tellurium. In some embodiments, the materials 17, 21, 27 and 31 may be considered to be electrically conductive barrier materials, and the material 34 may be considered to be an electrically insulative barrier material. Regions of the memory cell are encapsulated by the electrically conductive and electrically insulative barrier materials; and such regions may be thereby protected from having components migrate out of the them, and/or from having components migrate into them.

Another dielectric material 36 is provided laterally outwardly of the dielectric material 34. In some embodiments, dielectric material 36 may comprise a low k material (with "low k" dielectric materials being dielectric materials having dielectric constants less than or equal to that of silicon dioxide); and may, for example, comprise one or more of silicon dioxide, vacuum and gas. For instance, the dielectric material 36 may comprise porous silicon dioxide, and/or may correspond to a gap between adjacent liners of material 34.

Although the construction 10 is shown to comprise the low k dielectric material 36 utilized in combination with the high k dielectric material 34, in some embodiments the low k material 36 may be omitted and replaced with additional high k dielectric material 34, or vice versa.

The embodiment of FIGS. 1 and 2 has the ion source material 24 between the programmable material 22 and the second electrode 28. In other embodiments, the ion source material may be provided between the programmable material and the first electrode. FIG. 3 shows a construction 10a illustrating an example embodiment memory cell 12a in which the programmable material is between the ion source material and the first electrode. Similar numbering will be utilized to describe the embodiment of FIG. 3 as is used above to describe the embodiment of FIGS. 1 and 2, where appropriate.

The construction 10a has ion source material 24 provided at the bottom of an opening between the liners of material 34, and directly against an upper surface of the bottom electrode 18. The trench-shaped structure of programmable material 22 is formed over and directly against the ion source material 24, and the upper electrode 28 is formed within the opening in the trench-shaped structure.

The embodiment of FIG. 3 may comprise an electrochemically active surface of electrode 28 directly against the programmable material 22, and may comprise an electrochemically inactive surface of electrode 18 directly against the ion source material 24. Thus, the electrochemical activity of electrodes 18 and 28 may be reversed in the embodiment of FIG. 3 relative to the embodiment of FIGS. 1 and 2.

Figure 4:
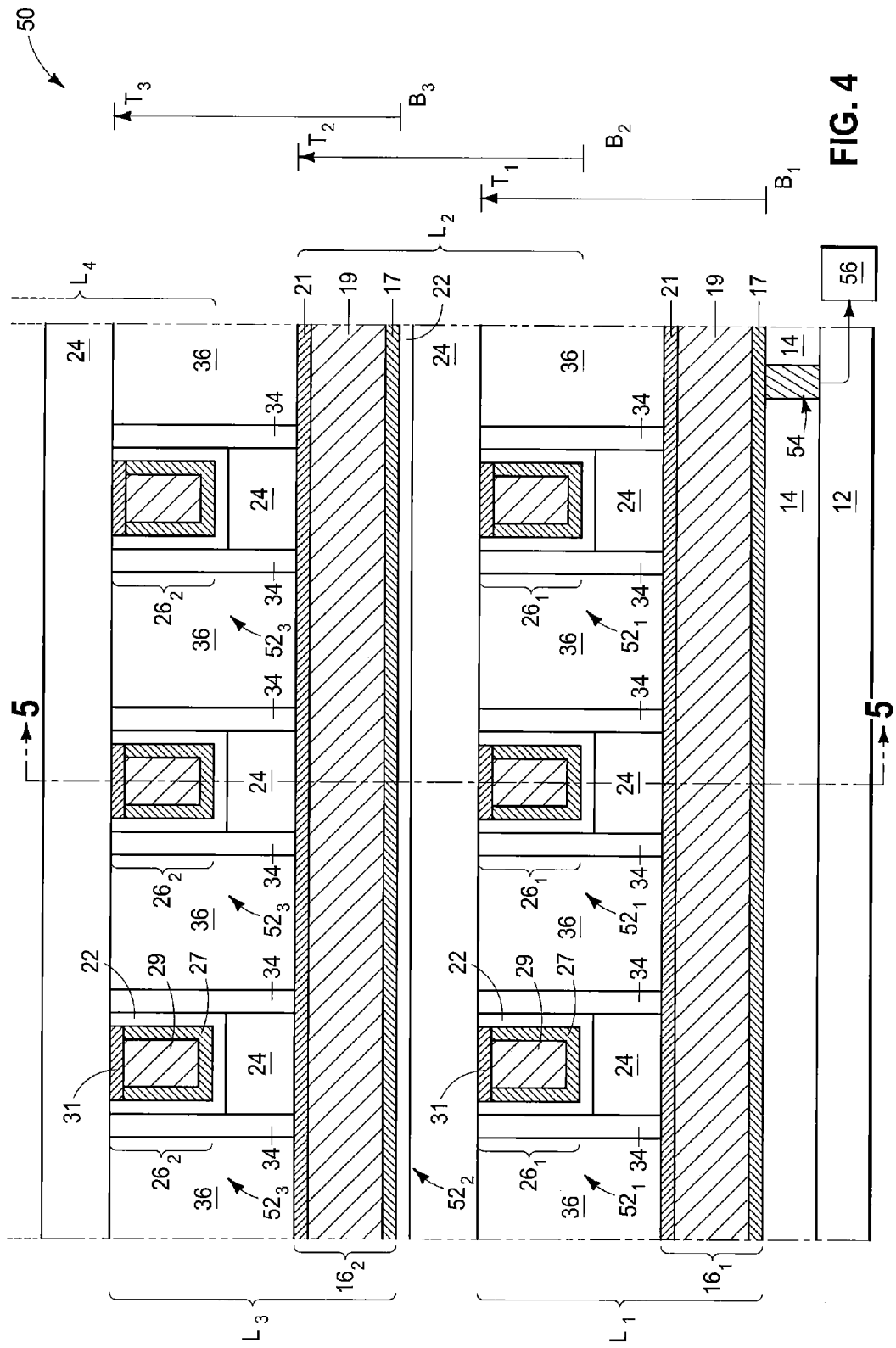
FIGS. 4 and 5 are diagrammatic cross-sectional views of an example embodiment memory cell array. The view of FIG. 4 is along the line 4-4 of FIG. 5, and the view of FIG. 5 is along the line 5-5 of FIG. 4.
Figure 5:
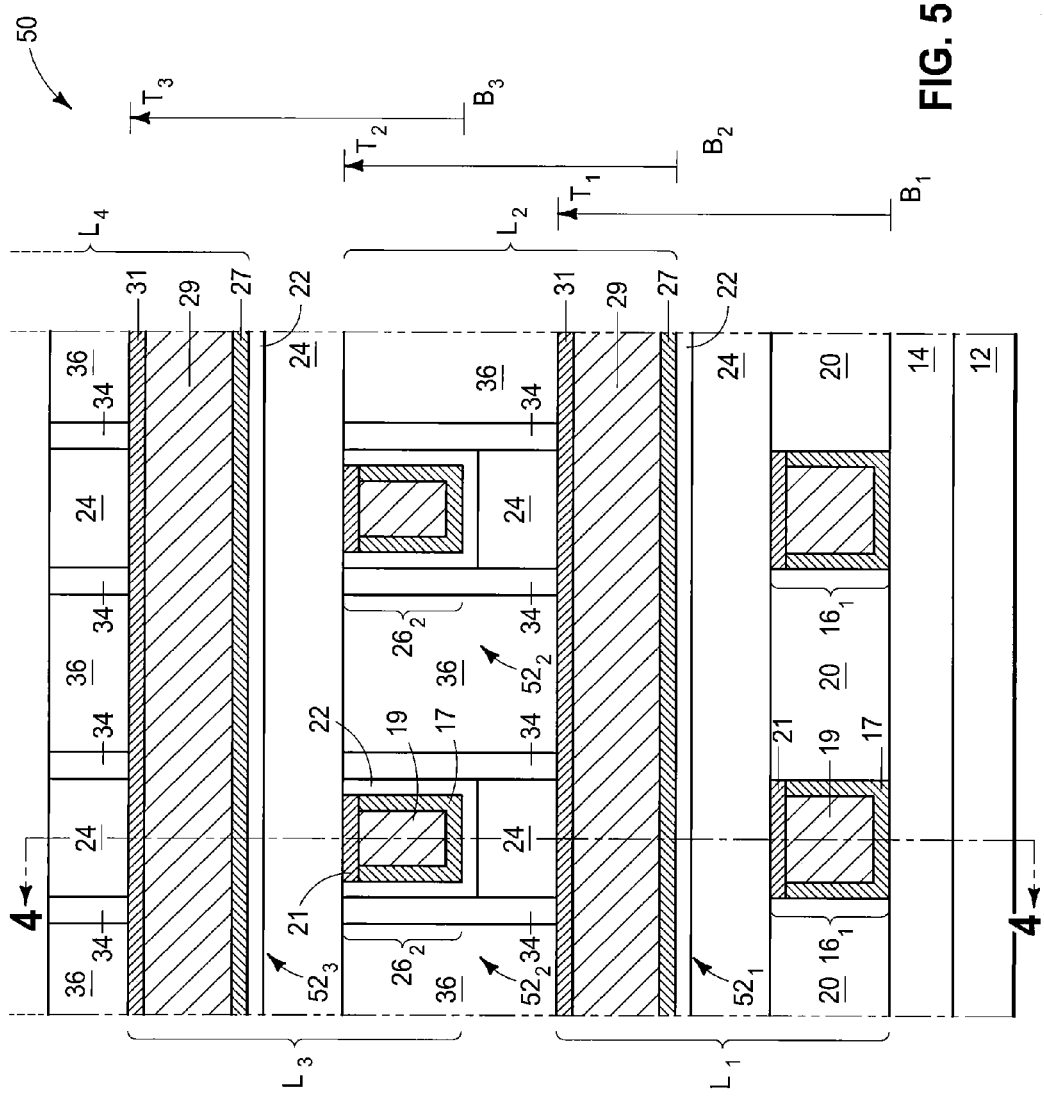

FIGS. 4 and 5 illustrate a construction 50 comprising an example embodiment array of memory cells. Similar numbering will be utilized to describe the embodiment of FIGS. 4 and 5 as is used above to describe the embodiments of FIGS. 1-3, where appropriate.

The construction 50 comprises a plurality of memory cells 52 arranged in three different levels $L_1$-$L_3$. The memory cells within level $L_1$ are labeled as cells $52_1$, those within level $L_2$ are labeled as cells $52_2$, and those within level $L_3$ are labeled as cells $52_3$. The illustrated memory cells are analogous to the cell 12a of FIG. 3. In other embodiments, cells analogous to the cell 12 of FIGS. 1 and 2 may be utilized.

Each level comprises a pair of conductive lines 16 and 26. The conductive lines are shared between adjacent levels in the illustrated embodiment, and thus there are only four conductive lines even though there are three levels. The lowest lines are labeled $16_1$, and comprise bottom electrodes for the memory cells $52_1$. The lines of the next level are labeled $26_1$ and comprise top electrodes for the memory cells $52_1$ and bottom electrodes for the memory cells $52_2$. The lines of the next level are labeled $16_2$ and comprise top electrodes for the memory cells $52_2$ and bottom electrodes for the memory cells $52_3$ Finally, the lines of the top level are labeled $26_2$ and comprise top electrodes for the memory cells $52_3$.

The alternating labels 16 and 26 are utilized to assist in describing the arrangement of the lines relative to the memory cells, and not to indicate compositional differences between lines labeled 16 and those labeled 26. The lines 26 are shown comprising materials 27, 29 and 31 to be consistent with FIGS. 1-3, and the lines 16 are shown comprising materials 17, 19 and 21 to be consistent with such figures. However, as discussed above with reference to FIGS. 1-3, materials 27, 29 and 31 may be identical to materials 17, 19 and 21. Thus, lines labeled 16 may be compositionally identical to those labeled 26 in some embodiments. The lines 16 extend along a first direction, and the lines 26 extend along a second direction that intersects the first direction so that the lines 26 overlap the lines 16. The memory cells 52 are formed at cross-points where the lines 26 overlap the lines 16.

In the shown embodiment, the programmable material 22 of the memory cells 52 is configured as trench-shaped structures that extend substantially orthogonally to the lines 16, and the lines 26 are entirely contained within openings in such trench-shaped structures. The memory cells 52 comprise regions of the programmable material 22 and the ion source 24 that are directly between overlapping segments of lines 16 and 26.

In the shown embodiment, the ion source material 24 forms a plurality of lines that are directly under the trench-shaped structures containing the programmable material 22, and coextensive with such trench-shaped structures.

Structures comprising dielectric material 34 are adjacent the memory cells 52, and are entirely along sides of the lines of the ion source material 24 in the shown embodiment. Such structures may be referred to as liners. In the shown embodiment, the low k dielectric material 36 is provided between adjacent liners of the dielectric material 34. As discussed previously, in some embodiments the dielectric material 34 may comprise high k dielectric material (such as silicon nitride), and the low k dielectric material may comprise one or both of silicon dioxide and gas. In some embodiments, the low k dielectric material 36 may be omitted and the high k dielectric material 34 may extend entirely across the gaps between adjacent memory cells, or vice versa.

A lower line $16_1$ is shown to be electrically coupled to external circuitry 56 through a conductive interconnect 54. The conductive interconnect may comprise any suitable material, and in some embodiments may comprise a metal, such as, for example, tungsten. The external circuitry 56 may be utilized for reading from and/or writing to the memory cells adjacent the line $16_1$. The other lines $16_2$, $26_1$, and $26_2$ may be electrically connected to similar circuitry. In operation, each of the individual memory cells may be uniquely addressed through paired combinations of the conductive lines.

The illustrated levels $L_1$-$L_3$ represent multiple vertical levels, or tiers, of a memory array. Each vertical level may be considered to have a bottom below the upwardly opening trench structure of the programmable material 22, and to have a top in opposing relation to the bottom. The tops of the levels $L_1$-$L_3$ are labeled as $T_1$-$T_3$, and the bottoms of such levels are labeled as $B_1$-$B_3$. The terms "bottom" and "top" are used to define an orientation of a memory cell relative to the trench-shaped programmable material of the memory cell, and provide terminology for comparing vertical orientations of the various levels of a memory array. The "bottom" of a memory cell is the portion of the memory cell adjacent the closed end of the trench-shaped programmable material, and the "top" is the portion of the memory cell adjacent the open end of such trench. As will become clear from the discussion that follows, memory cells may be sometimes be arranged with the "bottom" below the "top", and may be sometimes arranged with the "bottom" above the "top".

Figure 8:
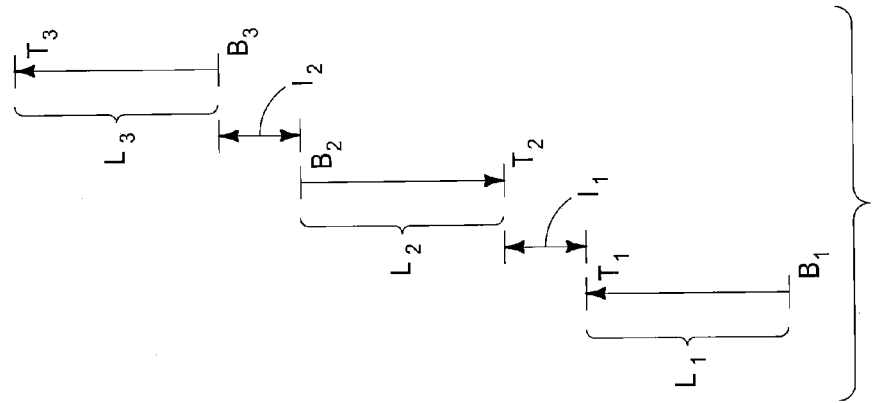
FIGS. 6-8 are diagrammatic illustrations of various level-stacking configurations that may be utilized in some example embodiment memory cell arrays. The configuration of FIG. 6 encompasses the example embodiment memory cell array of FIGS. 4 and 5.
Figure 7:
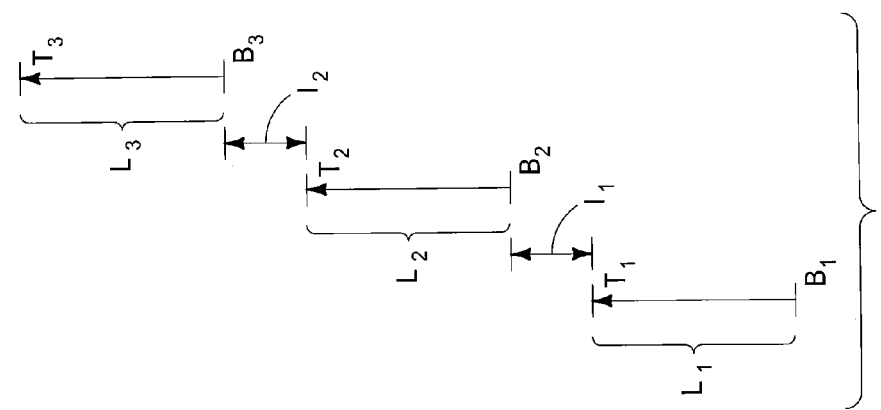
Figure 6:
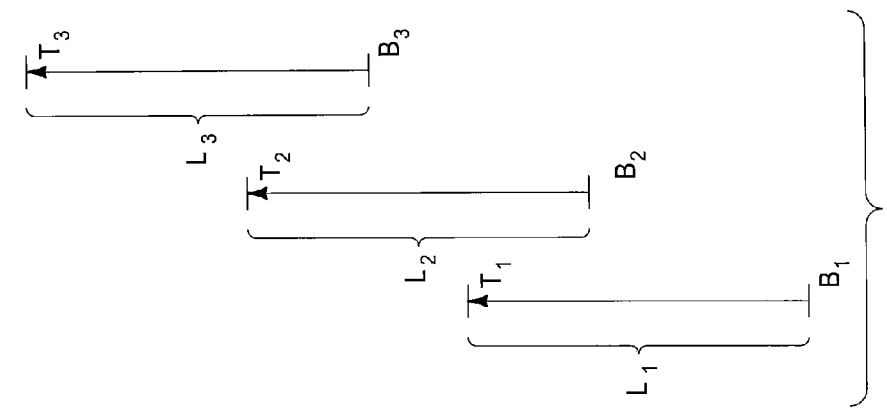

Each of the levels $L_1$-$L_3$ has a vertical arrangement between the "tops" and "bottoms" of the memory cells contained therein, with such vertical arrangements being shown with arrows extending from the bottoms to the tops of the levels (e.g., the arrow extending from $B_1$ to $T_1$). In the shown embodiment, each level has the same vertical arrangement as the others (specifically, the "top" of each level is vertically above the "bottom"). FIGS. 6-8 diagrammatically illustrate some example embodiments of vertical arrangements of levels within memory arrays that may be utilized in some embodiments.

FIG. 6 shows the same vertical arrangement as is present in the embodiment of FIGS. 4 and 5. Notably, all of the levels are oriented in the same direction, with the "top" over the "bottom", and the levels vertically overlap so that the "bottom" of a level overlaps the "top" of the level immediately below it.

FIG. 7 shows an embodiment similar to that of FIG. 6, except that vertical memory cell levels are spaced from one another by insulative levels ($I_1$ and $I_2$), and thus the memory cell levels do not vertically overlap one another. The insulative levels may comprise any suitable dielectric material, and in some embodiments may comprise silicon dioxide.

FIG. 8 shows an embodiment in which the vertical memory cell levels are spaced from one another by insulative levels ($I_1$ and $I_2$), and in which some of the memory cell levels are inverted relative to others (specifically, memory cell levels $L_1$ and $L_3$ are arranged with the "top" above the "bottom," and memory cell level $L_2$ is arranged with the "bottom" above the "top"). Although FIG. 8 shows insulative levels $I_1$ and $I_2$ between the various memory cell levels, in other embodiments such insulative levels may be omitted.

Figure 9:
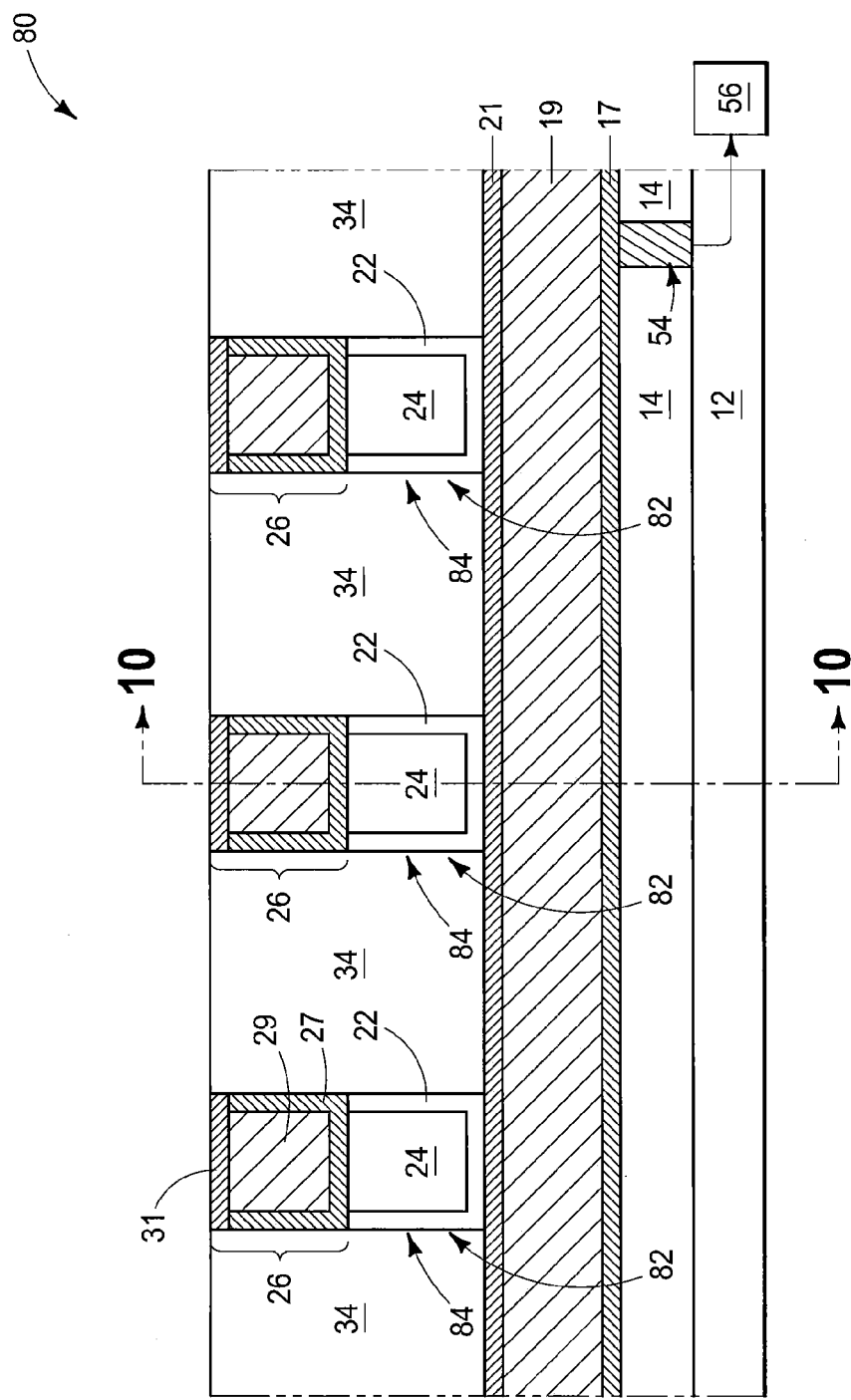
FIGS. 9 and 10 are diagrammatic cross-sectional views of another example embodiment memory cell array. The view of FIG. 9 is along the line 9-9 of FIG. 10, and the view of FIG. 10 is along the line 10-10 of FIG. 9.
Figure 10:
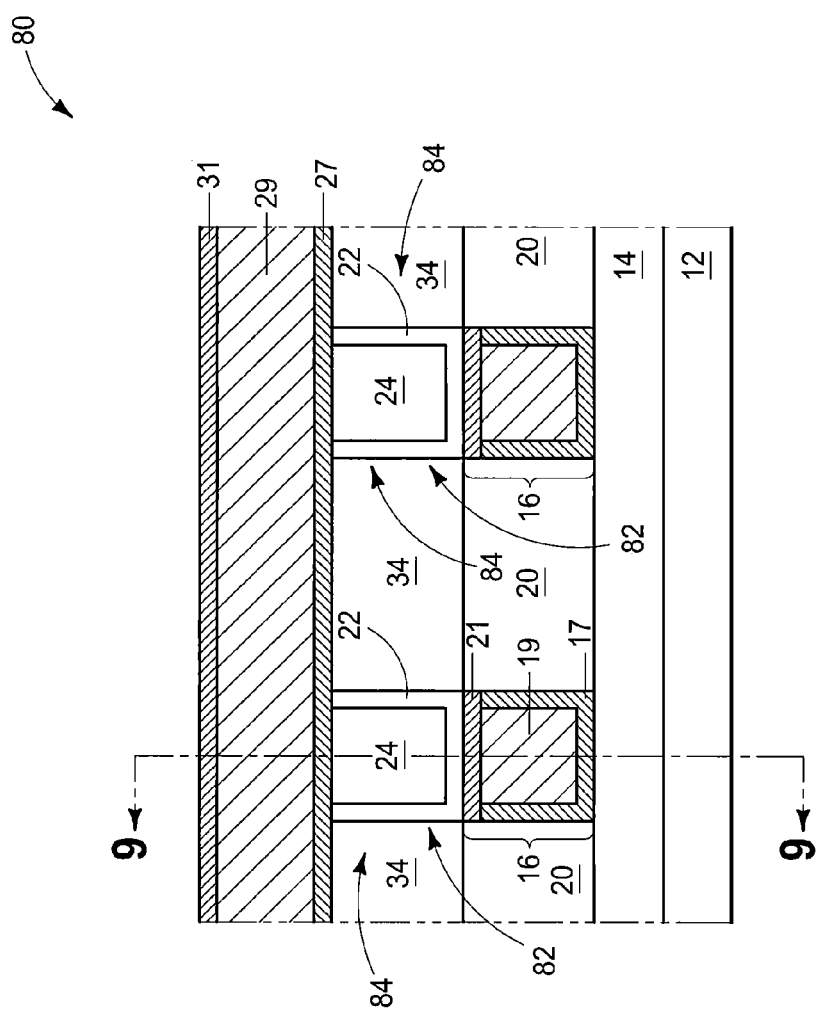

FIGS. 9 and 10 illustrate a construction 80 comprising another example embodiment array of memory cells.

The construction 80 comprises a plurality of memory cells 82. The illustrated memory cells are analogous to the cell 12 of FIGS. 1 and 2. In other embodiments, cells analogous to the cell 12a of FIG. 3 may be utilized.

The memory cells comprise trench-shaped structures of programmable material 22, and comprise ion source material 24 within openings defined by the trench shapes. The trench-shaped structures form a plurality of spaced-apart pedestals 84 that extend between a lower conductive line 16 and an upper conductive line 26. The ion source material 24 is entirely contained within the spaced-apart pedestals.

In the shown embodiment, the dielectric material 36 is entirely along lateral peripheries of the pedestals 84. The dielectric material 36 (FIGS. 4 and 5) is omitted from the embodiment of FIGS. 9 and 10 so that the dielectric material 34 extends entirely across gaps between adjacent pedestals 84. In other embodiments, dielectric material 36 could be included in regions between adjacent dielectric material liners analogously to the embodiment discussed above with reference to FIGS. 4 and 5.

The memory cells and arrays discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

In some embodiments, a memory cell comprises a first electrode and a trench-shaped programmable material structure over the first electrode. The trench-shape defines an opening therein. The programmable material is configured to reversibly retain a conductive bridge. The memory cell is in a low resistive state when the conductive bridge is retained within the programmable material and is in a high resistive state when the conductive bridge is not within the programmable material. An ion source material is directly against the programmable material. A second electrode extends into the opening defined by the trench-shaped programmable material.

In some embodiments, a memory cell comprises a first electrode and a trench-shaped programmable material structure over the first electrode. The trench-shape defines an opening therein. The programmable material is configured to reversibly retain a conductive bridge. The memory cell is in a low resistive state when the conductive bridge is retained within the programmable material and is in a high resistive state when the conductive bridge is not within the programmable material. An ion source material is entirely contained within the opening defined by the trench-shaped programmable material structure. A second electrode is over the ion source material.

In some embodiments, an array of memory cells comprises a first electrically conductive line extending along a first direction, and a plurality of trench-shaped programmable material structures over the first line. The trench-shaped structures extend along a second direction which intersects the first direction. The individual trench-shaped structures have openings defined therein. The programmable material is configured to reversibly retain conductive bridges within individual memory cells to transition the memory cells between low and high resistive states. Ion source material is comprised by the individual memory cells and is directly against the programmable material. Second electrically conductive lines extend into the openings defined by the trench-shaped programmable material structures. Individual memory cells comprise regions of programmable material and ion source material directly between the first and second lines.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An array of memory cells, comprising:
a first electrically conductive line extending along a first direction;
a plurality of trench-shaped programmable material structures over the first electrically conductive line; the trench-shaped programmable material structures extending along a second direction which intersects the first direction; the individual trench-shaped programmable material structures having openings defined therein, the trench-shaped programmable material structures being configured to reversibly retain conductive bridges within individual memory cells to transition the memory cells between low and high resistive states;
ion source material comprised by the individual memory cells and being directly against the trench-shaped programmable material structures;
second electrically conductive lines that extend into the openings defined by the trench-shaped programmable material structures; individual memory cells comprising regions of programmable material and ion source material directly between the first and second electrically conductive lines; and
wherein the first and second electrically conductive lines, and the programmable material and ion source material between the first and second electrically conductive lines, together form a first level of the array; the level having a vertical arrangement from the first electrically conductive line to the second electrically conductive lines; and further comprising a second level over the first level; said second level having the same vertical arrangement as the first level.

2. An array of memory cells, comprising:
a first electrically conductive line extending along a first direction;
a plurality of trench-shaped programmable material structures over the first electrically conductive line; the trench-shaped programmable material structures extending along a second direction which intersects the first direction; the individual trench-shaped programmable material structures having openings defined therein, the trench-shaped programmable material structures being configured to reversibly retain conductive bridges within individual memory cells to transition the memory cells between low and high resistive states;
ion source material comprised by the individual memory cells and being directly against the trench-shaped programmable material structures;
second electrically conductive lines that extend into the openings defined by the trench-shaped programmable material structures; individual memory cells comprising regions of programmable material and ion source material directly between the first and second electrically conductive lines; and
wherein the first and second electrically conductive lines, and the programmable material and ion source material between the first and second electrically conductive lines, together form a first level of the array; the level having a vertical arrangement from the first electrically conductive line to the second electrically conductive lines; and further comprising a second level over the first level; said second level having an opposite vertical arrangement relative to the first level.

3. An array of memory cells, comprising:
a first electrically conductive line extending along a first direction;
a plurality of trench-shaped programmable material structures over the first electrically conductive line; the trench-shaped programmable material structures extending along a second direction which intersects the first direction; the individual trench-shaped programmable material structures having openings defined therein, the trench-shaped programmable material structures being configured to reversibly retain conductive bridges within individual memory cells to transition the memory cells between low and high resistive states;
ion source material comprised by the individual memory cells and being directly against the trench-shaped programmable material structures;
second electrically conductive lines that extend into the openings defined by the trench-shaped programmable material structures; individual memory cells comprising regions of programmable material and ion source material directly between the first and second electrically conductive lines;
wherein the individual memory cells comprise the ion source material between the first electrically conductive line and the programmable material; and
wherein the ion source material is configured as lines coextensive with the trench-shaped programmable material structures.

4. The array of claim 3 further comprising high k dielectric liners entirely along sides of the ion source material line.

5. An array of memory cells, comprising:
a first electrically conductive line extending along a first direction;
a plurality of trench-shaped programmable material structures over the first electrically conductive line; the trench-shaped programmable material structures extending along a second direction which intersects the first direction; the individual trench-shaped programmable material structures having openings defined therein, the trench-shaped programmable material structures being configured to reversibly retain conductive bridges within individual memory cells to transition the memory cells between low and high resistive states;
ion source material comprised by the individual memory cells and being directly against the trench-shaped programmable material structures;

second electrically conductive lines that extend into the openings defined by the trench-shaped programmable material structures; individual memory cells comprising regions of programmable material and ion source material directly between the first and second electrically conductive lines;

wherein the individual memory cells comprise the ion source material between the first electrically conductive line and the programmable material; and wherein the trench-shaped programmable material structures are a plurality of spaced-apart pedestals extending between the first electrically conductive line and the second electrically conductive lines.

6. The array of claim 5 further comprising high k dielectric material along lateral peripheries of the spaced-apart pedestals.

7. An array of memory cells, comprising:

a first electrically conductive line extending along a first direction;

a plurality of trench-shaped programmable material structures over the first electrically conductive line; the trench-shaped programmable material structures extending along a second direction which intersects the first direction; the individual trench-shaped programmable material structures having openings defined therein, the trench-shaped programmable material structures being configured to reversibly retain conductive bridges within individual memory cells to transition the memory cells between low and high resistive states;

ion source material comprised by the individual memory cells and being directly against the trench-shaped programmable material structures;

second electrically conductive lines that extend into the openings defined by the trench-shaped programmable material structures; individual memory cells comprising regions of programmable material and ion source material directly between the first and second electrically conductive lines; and wherein the first electrically conductive line comprises a core that contains copper, and wherein the first electrically conductive line further comprises copper barrier material between the core and the programmable material.

8. The array of claim 7 wherein the copper barrier material comprises cobalt, tungsten and phosphorus.

9. An array of memory cells, comprising:

a first electrically conductive line extending along a first direction;

a plurality of trench-shaped programmable material structures over the first electrically conductive line; the trench-shaped programmable material structures extending along a second direction which intersects the first direction; the individual trench-shaped programmable material structures having openings defined therein, the trench-shaped programmable material structures being configured to reversibly retain conductive bridges within individual memory cells to transition the memory cells between low and high resistive states;

ion source material comprised by the individual memory cells and being directly against the trench-shaped programmable material structures;

second electrically conductive lines that extend into the openings defined by the trench-shaped programmable material structures; individual memory cells comprising regions of programmable material and ion source material directly between the first and second electrically conductive lines; and wherein the second electrically conductive lines comprise cores that contain copper, and wherein the second electrically conductive lines further comprise copper barrier material directly against the copper-containing cores.

10. The array of claim 9 wherein the copper barrier material comprises cobalt, tungsten and phosphorus.

11. An array of memory cells, comprising:

a first electrically conductive line extending along a first direction;

a plurality of trench-shaped programmable material structures over the first electrically conductive line; the trench-shaped programmable material structures extending along a second direction which intersects the first direction; the individual trench-shaped programmable material structures having openings defined therein, the trench-shaped programmable material structures being configured to reversibly retain conductive bridges within individual memory cells to transition the memory cells between low and high resistive states;

ion source material comprised by the individual memory cells and being directly against the trench-shaped programmable material structures;

second electrically conductive lines that extend into the openings defined by the trench-shaped programmable material structures; individual memory cells comprising regions of programmable material and ion source material directly between the first and second electrically conductive lines; and comprising high k dielectric structures along outer sidewall edges of the trench-shaped programmable material structures, and comprising low k dielectric material between adjacent high k dielectric structures.

12. The array of claim 11 wherein the high k dielectric structures comprise silicon nitride.

13. The array of claim 11 wherein the low k dielectric material comprise silicon dioxide and/or gas.

* * * * *

UNITED STATES PATENT AND TRADEMARK OFFICE
CERTIFICATE OF CORRECTION

Page 1 of 1

PATENT NO.       : 8,536,561 B2
APPLICATION NO.  : 13/275168
DATED            : September 17, 2013
INVENTOR(S)      : Scott E. Sills et al.

It is certified that error appears in the above-identified patent and that said Letters Patent is hereby corrected as shown below:

In the Claims

Column 9, Line 51 – Insert --first-- before --level-- and after --the--.

Column 10, Line 16 – Insert --first-- before --level-- and after --the--.

Signed and Sealed this
Fourteenth Day of October, 2014

Michelle K. Lee
*Deputy Director of the United States Patent and Trademark Office*